(12) United States Patent
Pae et al.

(10) Patent No.: US 11,700,017 B2
(45) Date of Patent: Jul. 11, 2023

(54) METHOD AND SYSTEM FOR PROVIDING MINIMAL ALIASING ERROR CORRECTION CODE

(71) Applicant: Hongik University Industry-Academia Cooperation Foundation, Seoul (KR)

(72) Inventors: Sung Il Pae, Seou (KR); Kon Woo Kwon, Seoul (KR)

(73) Assignee: Hongik University Industry-Academia Cooperation Foundation, Seoul (KR)

( * ) Notice: Subject to any disclaimer, the term of this patent is extended or adjusted under 35 U.S.C. 154(b) by 0 days.

(21) Appl. No.: 17/524,803

(22) Filed: Nov. 12, 2021

(65) Prior Publication Data

US 2022/0158656 A1     May 19, 2022

(30) Foreign Application Priority Data

Nov. 19, 2020     (KR) .................. 10-2020-0155665

(51) Int. Cl.
*H03M 13/11*     (2006.01)
*H03M 13/09*     (2006.01)
*H03M 13/19*     (2006.01)
*H03M 13/15*     (2006.01)

(52) U.S. Cl.
CPC ..... *H03M 13/1108* (2013.01); *H03M 13/098* (2013.01); *H03M 13/1168* (2013.01); *H03M 13/1575* (2013.01); *H03M 13/19* (2013.01)

(58) Field of Classification Search
CPC ........... H03M 13/1108; H03M 13/098; H03M 13/1168; H03M 13/1575; H03M 13/19
See application file for complete search history.

(56) References Cited

U.S. PATENT DOCUMENTS

2017/0047948 A1*   2/2017   Teitel .................. H03M 13/116
2020/0210284 A1    7/2020   Somasekhar et al.

OTHER PUBLICATIONS

Office Action of Korean Patent Application No. 10-2020-0155665 dated Apr. 12, 2022.

\* cited by examiner

*Primary Examiner* — Thien Nguyen
(74) *Attorney, Agent, or Firm* — Revolution IP, PLLC

(57) ABSTRACT

Disclosed is a method and system for providing a minimal aliasing error correction code. In constructing a single error correction (SEC) code by constructing a parity check matrix H for a data length k applied to a device, as the SEC code is designed to be valid and minimize generation of aliasing by checking some bits rather than all bits when nonzero binary column matrices different from each other are arranged in the parity check matrix, destruction of information can be prevented, and reliability of a device applying the SEC, such as DRAM or the like, can be improved.

9 Claims, 4 Drawing Sheets

(a) correct decoding on 1-bit error occurrence (b) aliasing on 2-bit error occurrence FIG. 1
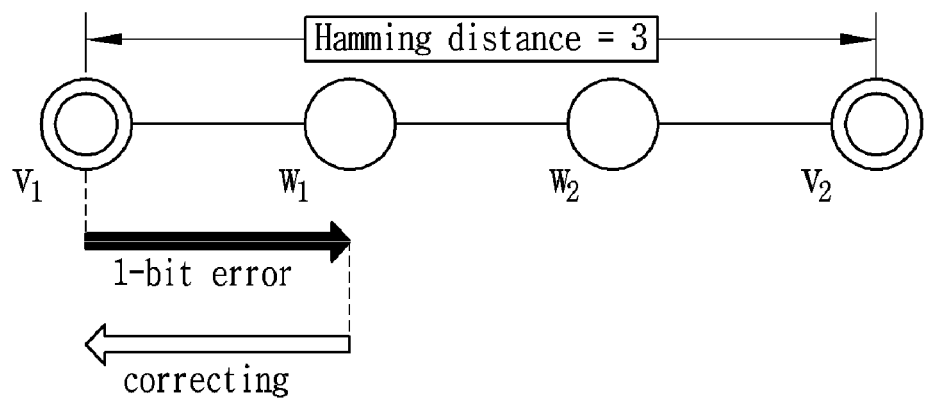
(a) correct decoding on 1-bit error occurrence
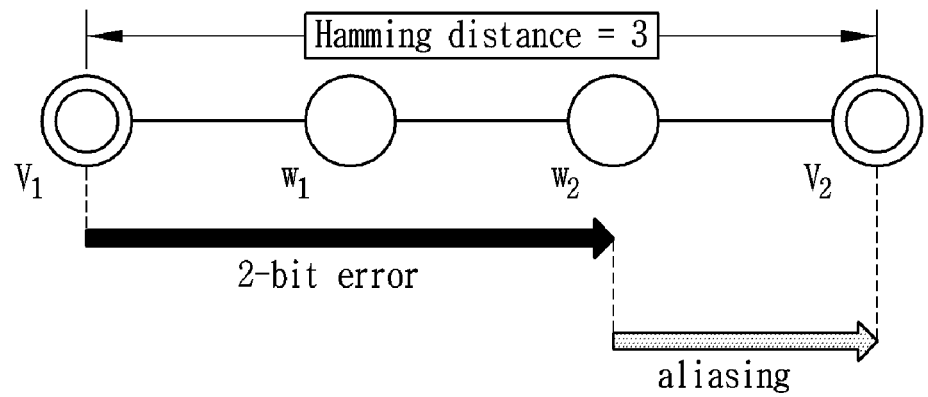
(b) aliasing on 2-bit error occurrence

FIG. 2

(a) $H = \begin{bmatrix} \overset{M}{\begin{array}{cccccccccc} 0 & 0 & 0 & 1 & 1 & 1 & 0 & 1 & 1 & 1 \\ 0 & 1 & 1 & 0 & 0 & 1 & 1 & 0 & 1 & 1 \\ 1 & 0 & 1 & 0 & 1 & 0 & 1 & 1 & 0 & 1 \\ 1 & 1 & 0 & 1 & 0 & 0 & 1 & 1 & 0 & 1 \end{array}} & \overset{C}{\begin{array}{cccc} 1 & 0 & 0 & 0 \\ 0 & 1 & 0 & 0 \\ 0 & 0 & 1 & 0 \\ 0 & 0 & 0 & 1 \end{array}} \end{bmatrix}$ (b) $H = \begin{bmatrix} \overset{M}{\begin{array}{ccccccc} 0 & 0 & 1 & 1 & 0 & 1 & 1 & 1 \\ 0 & 1 & 0 & 1 & 1 & 0 & 1 & 1 \\ 1 & 0 & 0 & 0 & 1 & 1 & 0 & 1 \\ 1 & 1 & 1 & 0 & 1 & 1 & 1 & 1 \end{array}} & \overset{C}{\begin{array}{cccc} 1 & 0 & 0 & 0 \\ 0 & 1 & 0 & 0 \\ 0 & 0 & 1 & 0 \\ 0 & 0 & 0 & 1 \end{array}} \end{bmatrix}$ (c) $H = \begin{bmatrix} \overset{M}{\begin{array}{ccccccc} 0 & 0 & 0 & 0 & 1 & 1 & 1 & 1 \\ 0 & 0 & 1 & 1 & 0 & 1 & 1 & 1 \\ 0 & 1 & 0 & 1 & 1 & 0 & 1 & 1 \\ 1 & 0 & 0 & 1 & 1 & 1 & 0 & 1 \end{array}} & \overset{C}{\begin{array}{cccc} 1 & 1 & 0 & 0 \\ 0 & 1 & 1 & 0 \\ 0 & 0 & 1 & 1 \\ 0 & 0 & 0 & 1 \end{array}} \end{bmatrix}$

METHOD AND SYSTEM FOR PROVIDING MINIMAL ALIASING ERROR CORRECTION CODE

CROSS REFERENCE TO PRIOR APPLICATIONS

This application claims priority to Korean Patent Application No. 10-2020-0155665 filed on Nov. 19, 2020, which is all hereby incorporated by reference in its entirety.

BACKGROUND OF THE INVENTION

Field of the Invention

The present invention relates to a method and system for providing a minimal aliasing error correction code, and more specifically, to a system for minimizing occurrence of aliasing in designing a single error correction (SEC) code for improving reliability of a device applying SEC, such as Dynamic Random. Access Memory (DRAM) or the like, and a method for providing the same.

Background of the Related Art

In transmitting or storing information through a semiconductor memory device or the like, data may be transmitted or stored after being encoded in the form of a binary data word, and in this case, since data may be damaged as data errors are included therein, the errors need to be detected or corrected to mitigate damage of the data, and an SEC code may be aliased into a 3-bit error due to false correction.

Therefore, it needs to provide a method of designing binary SEC while minimizing occurrence of aliasing.

SUMMARY OF THE INVENTION

Therefore, the present invention has been made in view of the above problems, and an object of the present invention is to improve reliability of a device applying SEC by finding a single error correction code generating minimal aliasing while reducing the number of operations since aliasing of overwhelmingly high probability occurs in a randomly selected code as the number of check bits increases in applying the SEC to a Dynamic Random. Access Memory (DRAM) device.

The problems of the present invention to be solved are not limited to those mentioned above, and other unmentioned problems will be clearly understood by those skilled in the art from the following description.

To accomplish the above object, according to one aspect of the present invention, there is provided a system for providing a minimal aliasing error correction code (ECC), the system comprising: a memory device including a plurality of memory cells; and a processor for receiving a message word having a length of k, generating a codeword having a parity check matrix and storing the codeword in the memory device, performing error correction code decoding on the basis of a syndrome generated using the codeword read from the memory device and the parity check matrix H, and outputting a decoded data.

The memory device includes a DRAM cell.

The processor includes: an encoder for receiving a message word having a length of k, and generating a codeword having an r*n parity check matrix H including an r*k data submatrix M containing k data bits and an r*r check submatrix C containing r check bits; and a decoder for implementing an ECC including a correction circuit that receives the codeword and corrects at least some of error bits included in the codeword on the basis of the syndrome generated using the codeword and the parity check matrix H, wherein r, k, and n are natural numbers greater than or equal to 1, $n=k+r$, and $k=2^{r-1}$.

The ECC includes single error correction (SEC), and all column vectors in the parity check matrix H have nonzero binary values different from each other.

The encoder 110 specifies a nonzero binary row vector v having a size of r, classifies a column vector having a result value of 0 obtained by multiplying the row vector v, among nonzero binary column vectors having a size of r, as a first column vector, and a column vector having a result value of non-0 as a second column vector, constructs the data submatrix M to include one of the first column vectors and k−1 of the second column vectors, and constructs the check submatrix C to include r−1 of the first column vectors and one of the second column vectors.

The check submatrix C is a reversible matrix.

The check submatrix C is an identity matrix.

Meanwhile, according to another embodiment of the present invention, there is provided a method of providing a minimal aliasing error correction code (ECC), the method comprising: a step of receiving a message word having a length of k, by a processor; an encoding step of generating a codeword having an r*n parity check matrix H including an r*k data submatrix M containing k data bits and an r*r check submatrix C containing r check bits, by the processor; and a decoding step of implementing an ECC including a correction circuit that receives the codeword and corrects at least some of error bits included in the codeword on the basis of a syndrome generated using the codeword and the parity check matrix H, by the processor, wherein r, k, and n are natural numbers, $n=k+r$, and r satisfies $k=2^{r-1}$.

The ECC includes single error correction (SEC), and all column vectors in the parity check matrix H have nonzero binary values different from each other.

The encoding step includes the steps of: specifying a nonzero binary row vector v having a size of r, by the processor; classifying a column vector having a result value of 0 obtained by multiplying the row vector v, among nonzero binary column vectors having a size of r, as a first column vector, and a column vector having a result value of non-0 as a second column vector, by the processor; constructing the data submatrix M to include one of the first column vectors and k−1 of the second column vectors, by the processor; and constructing the check submatrix C to include r−1 of the first column vectors and one of the second column vectors, by the processor.

The check submatrix C is a reversible matrix.

The check submatrix C is an identity matrix.

The decoding step includes the step of outputting the received codeword as a result value when the received codeword does not contain an error, on the basis of the syndrome.

The decoding step includes the step of outputting a codeword in which a 1-bit error is corrected as a result value when the received codeword contains the 1-bit error, on the basis of the syndrome.

BRIEF DESCRIPTION OF THE DRAWINGS

FIG. 1 is a view schematically showing an example in which 3-bit error aliasing occurs in an SEC-protected codeword.

FIG. 2 is an exemplary view showing SEC codes specified by a parity check matrix.

DESCRIPTION OF SYMBOLS

Figure 3:
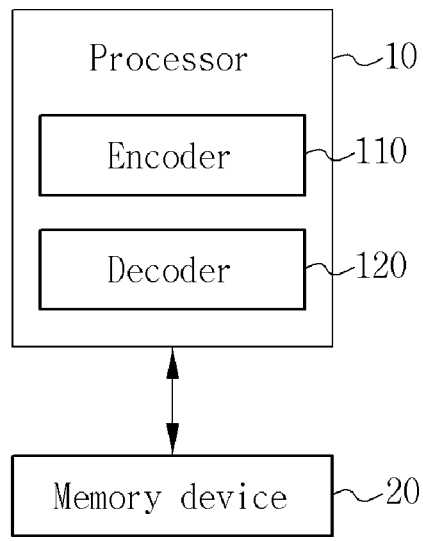
FIG. 3 is a block diagram schematically showing an error correction code providing system according to an embodiment.

1: Error correction code providing system
10: Processor
20: Memory device
110: Encoder
120: Decoder

DETAILED DESCRIPTION OF THE PREFERRED EMBODIMENT

The above objects, other objects, features and advantages of the present invention will be easily understood through the following preferred embodiments related to the accompanying drawings. However, the present invention is not limited to the embodiments described herein and may be embodied in other forms. Rather, the embodiments introduced herein are provided so that the disclosed contents may be thorough and complete and the spirit of the present invention may be sufficiently conveyed to those skilled in the art.

In this specification, when the terms such as first, second, and the like are used to describe components, these components should not be limited by these terms. These terms are only used to distinguish one component from another. The embodiments described and illustrated herein also include complementary embodiments thereof.

In addition, when it is stated that a certain element, component, device or system includes a component configured of a program or software, although not explicitly stated, it should be understood that the element, component, device or system includes hardware (e.g., memory, CPU, etc.) or other programs or software (e.g., an operating system, drivers needed for operating the hardware, etc.) needed for execution or operation of the program or software.

In addition, the terms used in this specification are for describing the embodiments and are not intended to limit the present invention. In this specification, singular forms also include plural forms unless specially stated otherwise in the phrases. The terms 'comprises' and/or 'comprising' used in this specification means that a stated component does not exclude presence or addition of one or more other components.

In addition, the terms such as ' . . . unit', ' . . . group', 'module' and the like mean a unit that processes at least one function or operation, and they may be implemented as hardware, software, or a combination of hardware and software. In addition, the articles such as 'a', 'an', and 'the' in the context of describing the present invention may be used as a meaning that includes both the singular and plural forms unless indicated otherwise herein or clearly contradicted by the context in the context describing the present invention.

In describing specific embodiments below, various characteristic contents are prepared to describe the present invention in more detail and help understanding. However, a reader having knowledge in this field enough to understand the present invention may recognize that the present invention may be used without these various characteristic contents.

It is mentioned in advance that in describing the invention, those parts that are commonly known and not greatly related to the present invention will not be described in some cases to avoid confusion without any particular reasons in explaining the invention.

Hereinafter, specific technical contents to be embodied in the present invention will be described in detail with reference to the accompanying drawings.

FIG. 1 is a view schematically showing an example in which 3-bit error aliasing occurs in an SEC-protected codeword.

Referring to FIG. 1, the phenomenon of aliasing can be explained.

When an error correction code (ECC) used outside a DRAM chip is referred to as an external ECC, the external ECC generally uses at least single error correction and double error detection (SECDED) within the range of ECC strength.

However, in the case of an In-DRAM ECC mainly presented in the embodiment of the present invention, single error correction (SEC) codes are mainly used due to small storage space and area overheads, and the ECC protects data from errors by generating redundant information called check bits, and a strong ECC checks more bits.

Since modern DRAM devices are designed with internal subarrays of 8-bit width due to the wiring limitation of DRAM banks, the check bits are typically in multiples of eight, and as an SEC code using eight check bits may protect memory data at a 128-bit granularity, a 6.25% storage overhead is required.

On the contrary, an SECDED code may use eight check bits to protect 64 bits of memory data (12.5% overhead).

Since the In-DRAM ECC should be implemented in each DRAM chip, SEC codes are preferred due to their smaller storage area and overheads for check bits.

However, in the case of a data protected by SEC, a 2-bit error may be adversely aliased into a 3-bit error due to a false correction.

Codewords of an SEC code are guaranteed to have a Hamming distance of at least three.

It is noted in advance that although SEC applicable to In-DRAM is described in this embodiment, the applicable scope of the method and system according to an embodiment of the present invention is not limited only to DRAM, and the method and system may be used in a device that applies the SEC.

Referring to FIG. 1, considering codewords v1 and v2 that have a Hamming distance of three, when v1 receives two errors and results in w2 and the Hamming distance between w2 and v2 is one, an SEC decoder incorrectly interprets the word w2 as v2, and this phenomenon is called aliasing.

Since the number of error bits in a DRAM chip increases from two to three due to this phenomenon, this may lead to damage of data as aliasing is likely to increase the number of errors detected in the system when the error bits are exposed to systems outside the DRAM chip.

FIG. 2 is an exemplary view showing SEC codes specified by a parity check matrix. A codeword generated by the encoder 110 according to an embodiment is a codeword in a system code, and may include message bits stored in the DRAM chip and searched later and check bits visible only within the DRAM chip to protect In-DRAM data. Since only the message bits are visible from the outside of the DRAM when data included in the memory device 20 is searched later, aliasing related to the three error bits occurring only in the message bits may be a problem.

A parity check matrix included in the codeword generated by the encoder 110 may be denoted by H hereinafter. The encoder 110 may construct the parity check matrix to generate a codeword.

The rank of the parity check matrix H is r, and the parity check matrix H is an r*n matrix. SEC is possible when the parity check matrix H is capable of correcting all single bit errors related to SEC that uses H and all single bit errors related to syndrome decoding for the code determined by H.

H is capable of SEC only when H is constructed to include only distinct column vectors not 0.

H includes a data submatrix M and a check submatrix C, where H=[M|C].

H=[M|C] is a parity check matrix for an (n, k) binary code, where M is an r*k matrix and C is an r*r matrix. The code determined by H is valid only when C is an invertible matrix.

Here, the invertible matrix means a matrix having an inverse matrix, and a result obtained by multiplying the inverse matrix is an identity matrix.

Accordingly, in the embodiment of the present invention, the parity check matrix H=[M|C] of an SEC code should include a submatrix C configured of invertible nonzero column vectors.

In most application programs, the parity check matrix is selected so that the submatrix C is an identity matrix.

Referring to FIG. 2, (15,11) code of (a) is a complete Hamming code where H is configured of all nonzero 4-bit columns.

Hereinafter, a nonzero vector is any binary vector except the vectors in which all vector components are zero (zero vector).

Here, the submatrix M is configured of columns of weight 2 or more in any order, and the submatrix C is an identity matrix using column vectors of weight 1.

This code protects 11 bits of a message, and a shortened Hamming code may be used to make the message length at a power of two.

Referring to FIG. 2, an example of an SEC code specified by the parity check matrix (12, 8) code of (b) is a code that obtains a parity check matrix by removing three columns from M of (a).

In this code, r=4 and k=$2^{r-1}$=8.

Both the complete Hamming code and the shortened Hamming code are capable of SEC and systematic. This is since that all column vectors are distinct nonzero, and submatrix C is an identity matrix and thus is invertible.

However, not every SEC code is a Hamming code, and although the code of (c) in FIG. 2 is not an identity matrix, as it has an invertible submatrix C, it is an SEC code and systematic.

Although it is general to use a Hamming code in designing SEC, non-Hamming codes are also considered in the present invention for minimal aliasing code search.

The parity check matrix H of an r*n size may be expressed as H=[M|C]=[$h_1, h_2 \ldots h_k$|C]. Here, n=k+r, r≥4, k=$2^{r-1}$.

Here, $h_1, h_2, \ldots, h_k$ may represent a plurality of column vectors included in the data submatrix M, respectively.

For example, a case, in which when r=8 and k=$2^7$=128, H is configured of 128+8=136 nonzero column vectors having a size of 8, and C is an 8*8 invertible matrix, is considered.

When it is assumed that codeword v contains two errors at the i-th and j-th positions (1≤i, j≤k) and is retrieved as v'=v+$e_i$+$e_j$, the decoder 120 may generate a syndrome s=$h_i^T$+$h_j^T$. A result of decoding by the decoder 120 based on the syndrome s corresponds to one of following three cases.

1) When ($h_i$+$h_j$) is equal to ($h_m$), which is one of the column vectors of M, the syndrome is misinterpreted as a single-bit error at the m-th position. Accordingly, a double-bit error is aliased into a triple-bit error at the i-th, j-th, and m-th positions of the message.

2) When ($h_i$+$h_j$) is equal to one of the column vectors of C, an additional error is generated in the check bits. However, this additional error in the check bit is not exposed to the outside of the DRAM chip since only the message bits are searched when the decoder 120 reads data from the memory device 20.

3) When ($h_i$+$h_j$) is different from the columns of the parity check matrix, no additional error occurs.

Accordingly, aliasing occurs only when there are two errors at the i-th position and the j-th position and when there is a column vector $h_m$ of M that satisfies $h_i$+$h_j$+$h_m$=0 or $h_i$+$h_j$=$h_m$, and a set of three distinct vectors {$h_i$, $h_j$, $h_m$} taken from M is called as an aliasing triple of H.

The number of aliasing triples of H determines the probability of aliasing that will occur.

Hereinafter, an SEC code is provided so that at least $2^{r-2}$−1 aliasings may occur for a parity check matrix H having a size of r*(k+r) for an SEC code.

FIG. 3 is a block diagram schematically showing an error correction code providing system according to an embodiment.

An error correction code providing system 1 comprises a processor 10 including an encoder 110 and a decoder 120, and a memory device 20. The memory device 20 may include a plurality of memory cells. Here, the memory cell may be a DRAM cell.

The processor 10 may be a microprocessor or a central processing unit (CPU). The processor 10 may include one processor core (single-core) or a plurality of processor cores (multi-core). The processor 10 may include a memory controller that controls the operation of the memory device 20, and the memory controller may be shown in the form of the encoder 110 and the decoder 120 for error correction according to an embodiment. Accordingly, the processor 10 may include the encoder 110 and the decoder 120.

The encoder 110 may be implemented by various electronic devices. The encoder 110 may process information by encoding data using a binary alphabet. For example, the encoder 110 may encode data structures such as machine-readable objects, databases, programming instructions, addresses, executable libraries, and the like, as well as user data such as text, images, downloaded samples, and videos, in a sorted form of binary words. Encoded binary words may be stored in non-volatile memory (e.g., hard disks, solid state disks, magnetic media, or compact disks) or volatile media (e.g., random access memory (RAM) devices, dynamic random access memory (DRAM) devices, or cache memory of the processor 10). The encoded binary words may be transmitted over a wired connection, such as a USB connection, a PCI high-speed connection (PCIe), an Ethernet connection, or the like, or over a connection between devices, such as a Bluetooth connection, a cellular connection, a wireless Ethernet connection, or the like.

The memory device 20 may store or transmit information, and may send and receive signals to and from the processor 10 so that errors that may occur in the process of encoding the information may be detected and corrected.

Data errors may occur in the process of storing data in the memory device 20 from the outside or in the process of transmitting data stored in the memory device 20 to the outside by the processor 10. Random bit flip errors due to electromagnetic discharge or power spikes may occur in volatile or nonvolatile data. In addition, noise in a channel due to external interference or signal degradation may also generate bit flip errors. The bit flip error is an error of a case where a value of 0 is changed to 1 and vice versa in a RAM data stored as a binary data of a value of 0 or 1. The processor 10 may use an error correction code (ECC) to mitigate such errors, and the ECC may use parity bits to add redundancy to stored or transmitted data. In an embodiment, the processor 10 may generate parity bits as a parity check matrix H to identify the location of damaged bits and correct the damaged data.

Performance of the ECC may be expressed in terms of the number of damaged bits for a word that can be detected or corrected. Generally, performance of the ECC may be related to the number of parity bits with respect to a word. For example, the ECC may include a single error correction code (SEC) that corrects maximum one bit for a word, a double error correction code (DEC) that corrects maximum two bits for a word, a single error detection (SED) that detects errors maximum one bit of error for a word, and a double error detection code (DED) that detects maximum two bits of errors for a word. When the error exceeds the performance of the ECC, the error may not be detected or may contain additional errors or aliasing errors. For example, when aliasing occurs in a codeword of an SEC code, a word with a 2-bit error may become a word with a 3-bit error due to a correction attempt of the receiver.

In an embodiment, the encoder 110 and the decoder 120 may be designed to use an SEC code class that may prevent errors or lower the probability of aliasing errors. In an embodiment, the SEC code class related to the encoder 110 and the decoder 120 may make it possible to provide a reduced or minimal amount of aliasing errors for a specific number of word lengths or parity bits.

The processor 10 may receive a message word having a length of k, generate a codeword having a parity check matrix and store the codeword in the memory device, perform error correction code decoding on the basis of a syndrome generated using the codeword read from the memory device and the parity check matrix H, and output a decoded data.

The encoder 110 may receive a message word having a length of k from a host, other peripheral devices, or the outside, and output an encoded data to be written in the memory device 20.

The decoder 120 may perform error correction code decoding on the encoded data read from the memory device 20 and output a decoded data.

Hereinafter, it will be described in order of the encoder 110 and the decoder 120 to describe the operation of the processor 10 when data is stored in and read from the memory device 20 in the error correction code providing system 1.

The encoder 110 generates a codeword having an r*n parity check matrix H.

The decoder 120 implements an ECC including a correction circuit on the basis of the syndrome. Here, the ECC includes single error correction (SEC), and all column vectors in the parity check matrix H have different nonzero binary values.

After specifying a nonzero binary row vector v having a size of r, and classifying a column vector having a result value of 0 obtained by multiplying the row vector v, among nonzero binary column vectors having a size of r, as a first column vector, and a column vector having a result value of non-0 as a second column vector, the encoder 110 constructs the data submatrix M to include one of the first column vectors and k−1 of the second column vectors, and constructs the check submatrix C to include r−1 of the first column vectors and one of the second column vectors.

In this way, a parity check matrix H including a data submatrix M and a check submatrix C is generated.

Here, the check submatrix C is an invertible matrix, and when the check submatrix C is an identity matrix in this case, the parity check matrix H is established as a Hamming code.

Figure 4:
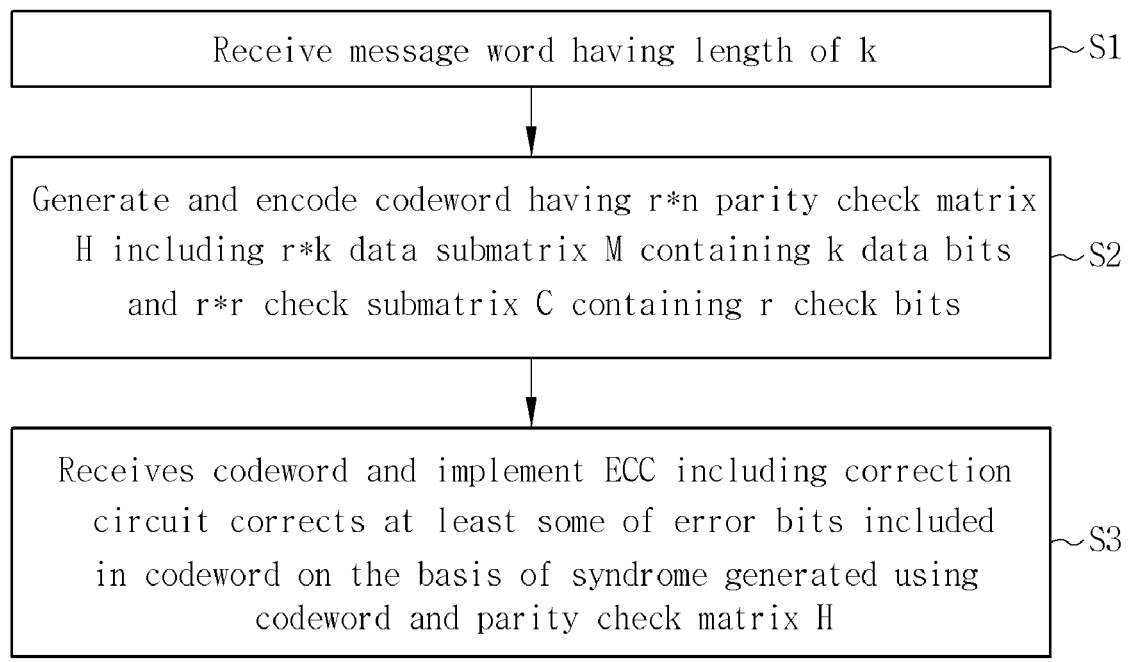
FIG. 4 is a flowchart illustrating a method of providing a minimal aliasing error correction code according to an embodiment.

FIG. 4 is a flowchart illustrating a method of providing a minimal aliasing error correction code according to an embodiment.

Here, the ECC includes Single Error Correction (SEC), and the parity check matrix H may be limited such that all column vectors have nonzero binary values different from each other.

The encoder 110 may receive a message word having a length of k (S1). The encoder 110 may set the length of the received message word to k. The encoder 110 may receive the message word from the outside of processor 10 or from another processor.

The encoder 110 generates and encodes a codeword having an r*n parity check matrix H including an r*k data submatrix M containing k data bits and an r*r check submatrix C containing r check bits (S2).

The encoder 110 may generate a data submatrix M having r rows and k columns by using length k of the message word. The encoder 110 may generate a check submatrix C having r rows and r columns. The check submatrix C may include r check bits. Here, the matrix including the data submatrix M and the check submatrix C generated by the encoder 110 is referred to as a parity check matrix H, and the parity check matrix H has r rows and n columns. Here, r, k, and n are natural numbers greater than or equal to 1, r satisfies $k=2^{r-1}$, and n=k+r. The encoder 110 generates a codeword having a parity check matrix H.

All column vectors included in the parity check matrix H have different values, and each column vector is nonzero.

Figure 5:
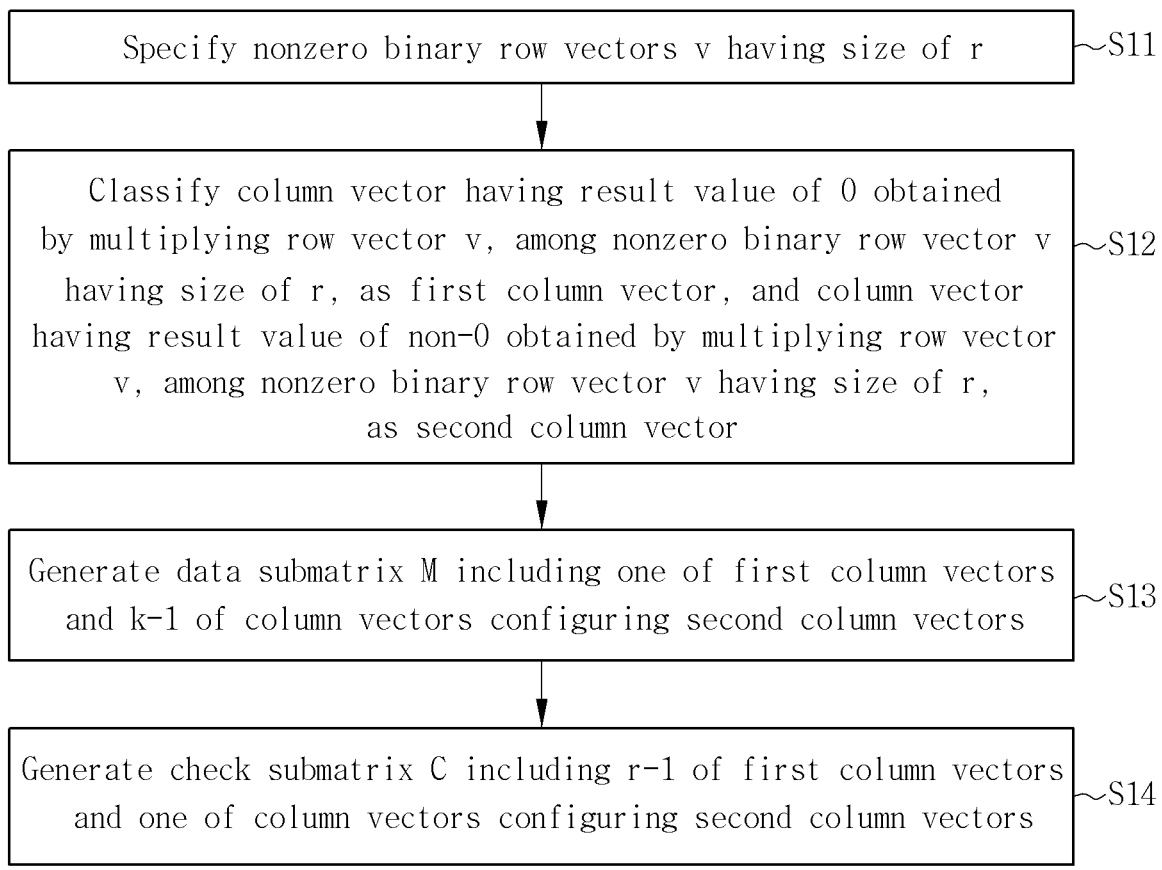
FIG. 5 is a detailed flowchart for explaining the encoding step of FIG. 4.

FIG. 5 is a detailed flowchart for explaining the encoding step of FIG. 4.

The encoder 110 specifies a nonzero binary row vector v having a size of r (S11).

The encoder 110 classifies a column vector having a result value of 0 obtained by multiplying the row vector v, among nonzero binary column vectors having a size of r, as a first column vector, and a column vector having a result value of non-0 obtained by multiplying the row vector v, among nonzero binary column vectors having a size of r, as a second column vector (S12).

The encoder 110 generates a data submatrix M configured of one of the first column vectors and k−1 of the column vectors configuring the second column vector (S13).

The encoder 110 generates a check submatrix C configured of r−1 of the first column vectors and one of the column vectors configuring the second column vector (S14).

This will be described below in detail.

Considering an F2 vector space V of dimension r having a size of $2^r$, l independent vector sets generate $2^l$ elements by generating an l-dimensional subspace of linear combinations. On the contrary, an (r−l)-dimensional subspace is determined as a solution set of l equations $v_1 \cdot x = 0, \ldots, v_l \cdot x = 0$ given by l independent vectors $v_1, \ldots, v_l$.

Hereinafter, a common operation and description of a plurality of nonzero binary row vectors $v_1, \ldots, v_l$ having a size of r may be expressed as v.

Particularly, in the case where v is a nonzero vector, x is said to be v-even when $v \cdot x = 0$. The v-even vector configures (r−1) subspaces.

In addition, all the (r−1) subspaces may be determined in this way by selecting a nonzero unique vector v.

Therefore, there are $(2^{r-1})$ subspaces of (r−1) dimension.

Here, when x is not v-even, i.e., when $v \cdot x = 1$, x is said to be v-even.

When v is fixed, we can simply call a vector such as x or the like as even or odd. Hereinafter, x, which is v-even, may be expressed as an even vector, and x, which is v-odd, may be expressed as an odd vector.

The vector space V may be partitioned into equivalent classes of even vectors E and odd vectors O, i.e., $v_1, v_2 \in O$ and $w_1, w_2 \in E$. An even vector is generated when two even vectors are added, an even vector is generated when two odd vectors are added, an odd vector is generated when one even vector and one odd vector are added.

At step S11, the encoder 110 specifies all nonzero binary row vectors v having a size of r. A nonzero binary column vector having a size of r includes a zero vector, $2^{r-1}$ even vectors, and $2^{r-1}$ odd vectors.

The row vector v specified by the encoder 110 at step S11 is a nonzero vector herein, which is a vector for distinguishing whether the column vectors of the data submatrix M and the check submatrix C are v-even or v-odd.

Thereafter, at step S12, the encoder 110 may classify $2^{r-1}$ even vectors as a first column vector and $2^{r-1}$ odd vectors as a second column vector.

For example, when $v = (1, 1, \ldots, 1)^r$, an even vector has the same meaning as a vector having a Hamming weight of an even number, and an odd vector has the same meaning as a vector having a Hamming weight of an odd number.

In addition, when $v = (1, 0, \ldots, 0)^r$, an even vector means a vector whose first coordinate is 0.

Now, as $k = 2^{r-1}$ and M is an r*k matrix, the most obvious way of finding H having minimal aliasing is that when $h_1, \ldots, h_k$, which are column vectors of M, have all odd vectors, it does not become 0 although any one of three different column vectors is added.

However, in this case, C is not invertible as it should be configured of only even vectors.

The encoder 110 should configure C as an invertible matrix and reduce the number of aliasing triples at the same time.

Therefore, C may be generated to be invertible using an odd vector, and instead, an even vector may be used for $h_k$ (the order of the column vectors of H is irrelevant).

Then, the number of aliasing triples may be $$\frac{k}{2} - 1 = 2^{r-1} - 1$$

(63 when r=8) regardless of the selection of excluded odd vectors or even vectors $h_k$.

The encoder 110 may generate a code generating minimal aliasing in this way. First, when $h_1, \ldots, h_{k-1}$ are odd numbers (vectors), and $h_k$ is an even number (vector), the number of aliasing triples in H is exactly $$\frac{k}{2} - 1.$$

This can be proved as follows.

For a nonzero even vector w, when v is one-to-one mapped to v+w, this mapping is a permutation of order 2 on O, which is a subset of odd vectors, or rather it may be viewed as a group operation on O.

Then, O may be partitioned into $$\frac{k}{2}$$

sets of {v, v'} orbits so that v+w=c' or equivalently v+w+v'=0. Accordingly, the even vector w configures exactly $$\frac{k}{2}$$

aliasing triples of a {w, v, v'} form, together with O.

Including $O = \{h_1, \ldots, h_{k-1}\} \cup \{h'\}$, when h' is an excluded odd vector, $h_k$ induces $$\frac{k}{2}$$

aliasing triples.

Therefore, excluding the aliasing triple containing h', H has exactly as many as $$\frac{k}{2} - 1$$

aliasing triples.

$M = \{h_1, \ldots, h_k\}$ includes l even vectors (accordingly, k−l odd vectors), and when $$1 \leq l \leq \frac{k}{2},$$

the number of aliasing triples of H is at least $$l \cdot \left(\frac{k}{2} - l\right).$$

When $w_1, \ldots, w_l$ are even vectors and $h_1', \ldots, h_l'$ are odd vectors excluded from M, at least one even vector should be included in the possible aliasing triples. This is since that an aliasing triple is in the form of {odd, odd, even} or {even, even, even}.

Since a lower bound is to be estimated, aliasing among even vectors $w_1, \ldots, w_l$ will be ignored.

Now, when possible aliasing triples associated with $h_j'$ are excluded for each $w_i$, at least $$\frac{k}{2} - l$$

aliasing triples are left. Here, i and j are integers greater than or equal to 1 and smaller than or equal to l, respectively.

Therefore, H has at least $$l \cdot \left(\frac{k}{2} - l\right)$$

aliasing triples.

The order of vectors in M is irrelevant as long as the number of aliasing triples in M is concerned.

When it is assumed that R is a matrix of vectors not included in M, all the vectors in the submatrix C are included in R, and R also includes 0 (zero vector).

Since the order of the vectors is not relevant, when the vectors are regarded as sets, M and R may be considered as partitions of V, and $0 \in R$, and $|M|=|R|=k$.

Since M has $k=2^{r-1}$ distinct (non-overlapping) nonzero vectors, the rank of matrix M is r.

Excluding the zero vector, R has $2^{r-1}-1$ distinct nonzero vectors, so that the rank of R is r−1 or r.

In the former case, the vectors in R include exactly an (r−1)-dimensional subspace.

In an embodiment, when rank(R)=r, M is said to be valid, otherwise, M can be said to be invalid.

This is since that when rank(R)=r, an invertible matrix C can be constructed from the vectors in R at all times, so that it is possible to have a proper parity check matrix H.

Proving this, when M is invalid, the vectors in R contains exactly (r−1) subspaces, and as a set, M is R's complement, so that there is a vector v in which vectors in R are v-even and vectors in M are v-odd, and the sum of the two vectors included in M belongs to R.

When it is assumed that M has no aliasing, R is closed under addition R so that R includes a subspace, which means that it is an (r−1)-subspace since it is large in size.

For a vector u of M, the following equation is established.

$R = \{u+v | v \in M\}$

Therefore, since there are $v1, v2 \in M$ for $w1, w2 \in R$, for which $w1=u+v1$ and $w2=u+v2$ is satisfied, $w1+w2=v1+v2 \in R$ is satisfied.

In the present disclosure, for a nonzero v and M, $l_v(M)$ indicates the number of v-even vectors included in M.

In addition, in a valid M, there is a nonzero vector v satisfying $$0 < l_v(M) < \frac{k}{2}.$$

The number of v-even vectors may vary depending on v, and when l is the number of even vectors included in M under the condition of in $$0 \leq l < \frac{k}{2},$$

it does not specify v under which even or odd vectors are determined. When existence of v that satisfies $$0 < l_v(M) < \frac{k}{2}$$

is found, the lower bound of aliasing can be found, and since existence of the nonzero vector v is guaranteed, the lower bound is $$l \cdot \left(\frac{k}{2} - l\right),$$

and it becomes $2^{r-2}-1$.

That is, for a valid M, at least $2^{r-2}-1$ aliasings occur.

To prove this, a case of $l_v(M)=0$ is excluded first since M is valid.

Existence of nonzero v that satisfies $$l_v(M) < \frac{k}{2} = 2^{r-2}$$

is proved by showing that the average number of even vectors for all nonzero v is slightly smaller than $2^{r-2}$ and may not be $l_v(W) \geq 2^{r-2}$ for all v, and therefore the average is greater than or equal to $2^{r-2}-1$.

Accordingly, it needs to prove that the average is slightly smaller than $2^{r-2}$.

When $M=[h_1 \, h_2 \, \ldots \, h_k]$, since $l_v(M)=\Sigma_{i=1}^{k}(v \cdot h_i+1)$, it is that $\Sigma_{v \neq 0} l_v(M)=\Sigma_{v \neq 0}\Sigma_{i=1}^{k}(v \cdot h_i+1)=\Sigma_{i=1}^{k}\Sigma_{v \neq 0}(v \cdot h_i+1)$.

For a fixed $h_i$, there are $2^{r-1}-1$ v's that make $h_i$ into v-even among $2^{r-1}-1$ possible nonzero v's (there are $2^{r-1}$ v's that make $h_i$ into v-odd among the v's), and therefore, since $\Sigma_{v \neq 0}(v \cdot h_i+1)=2^{r-1}-1$, $\Sigma_{v \neq 0} l_v(M)=2^{r-1}(2^{r-1}-1)$ is satisfied.

Therefore, the average value of all v's is $$\frac{2^{r-1}(2^{r-1}-1)}{2^r-1} = \frac{2^{r-2}(2^r-1-1)}{2^r-1} = 2^{r-2} - \frac{2^{r-2}}{2^r-1}.$$

Here, since $$\frac{1}{4} < \frac{2^{r-2}}{2^r-1} < \frac{1}{2},$$

it is proved that the average is slightly smaller than $2^{r-2}$.

For example, when n=4, a 4-vector may be expressed as an integer i ($0 \leq i \leq 15$).

In the example, when $$3 = \begin{pmatrix}0\\0\\1\\1\end{pmatrix}; 14 = \begin{pmatrix}1\\1\\1\\0\end{pmatrix}, 3 \oplus 14 = \begin{pmatrix}0\\0\\1\\1\end{pmatrix} + \begin{pmatrix}1\\1\\1\\0\end{pmatrix} = \begin{pmatrix}1\\1\\0\\1\end{pmatrix} = 13.$$

In relation to weights v=(1, 1, 1, 1)ᵀ, the odd vector set O and the even vector set M are as follows.

O={1, 2, 4, 7, 8, 11, 13, 14}
E={3, 5, 6, 9, 10, 12, 15}.
Here, it is assumed that M=[1, 2, 4, 7, 8, 11, 13, 5]

The first 7 vectors are odd vectors and the last vector 5 is the only even vector. There are three aliasing triples {1, 4, 5}, {2, 7, 5} and {8, 13, 5}.

In addition, in relation to weights v=(1, 0, 0, 0)ᵀ, the odd and even vector sets are as follows.

O'={8, 9, 10, 11, 12, 13, 14, 15}
E'={1, 2, 3, 4, 5, 6, 7}.

In addition, in this case, M has 5 even vectors (1, 2, 4, 5, 7) and 3 odd vectors (8, 11, 13).

Of course, the number of aliasing triples does not change depending on the way of considering a vector as even or odd, and it is still three.

When it varies like v=1, . . . , 15, distribution of $1_v(M)$, which is the number of even vectors included in M, is as follows.

3, 5, 4, 4, 5, 3, 4, 5, 4, 4, 3, 3, 4, 4, 1

In addition, when the binary row vector is v and the column vector is $h_i$, multiplication of obtaining the multiplied value is performed in the order of $v \cdot h_i$. At step S13, the encoder 110 configures the data submatrix M to include one v-even vector and k–1 v-odd vectors.

In addition, at step S14, the encoder 110 configures the check submatrix C to include r–1 v-even vectors and one v-odd vector.

The submatrix C like this is an invertible matrix, and is configured in a form in which an inverse matrix exists.

Among H matrices including the M and C submatrices, an H matrix, submatrix C of which is an identity matrix, corresponds to a Hamming code.

In this case, $$\frac{k}{2} - 1 = 2^{r-2} - 1$$

is guaranteed as the lower bound of the number of aliasings.

[Table 1] shows the experimental average number of aliasings for r=4, 5, 6, 7, and 8 and the number of minimal aliasings according to an embodiment of the present invention.

TABLE 1

| r | Minimal aliasings | Average |
|---|---|---|
| 4 | 3 | ≈4.30747 |
| 5 | 7 | ≈19.3087 |
| 6 | 15 | ≈81.3117 |
| 7 | 31 | ≈333.306 |
| 8 | 63 | ≈1349.32 |

Figure 6:
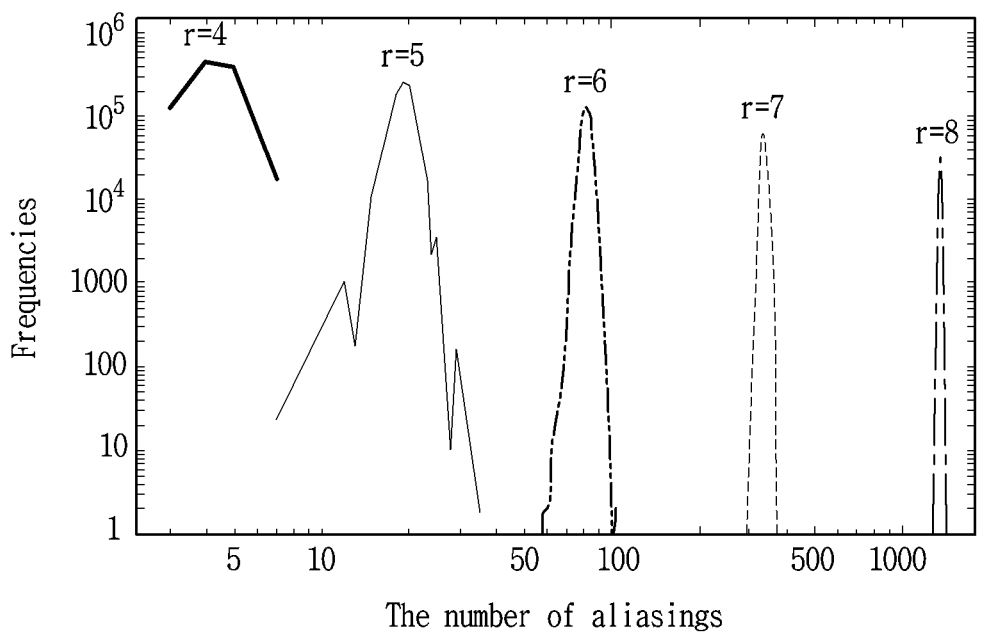
FIG. 6 is a view showing distribution of aliasing occurrence.

FIG. 6 is a view showing distribution of aliasing occurrence.

Referring to FIG. 6, distribution of the number of aliasings in one million randomly selected parity check matrices is shown.

As shown in [Table 1] and FIG. 6, when the SEC is designed only in accordance with the rule that the column vectors of H are all nonzero and do not overlap and the check submatrix C has an inverse matrix, it can be seen that distribution of average values increases greatly as r increases.

Therefore, according to an embodiment of the present invention, the SEC may be designed to generate minimal aliasing.

The decoder 120 implements an ECC including a correction circuit that receives the codeword and corrects at least some of error bits included in the codeword on the basis of the syndrome generated using the codeword and the parity check matrix H (S3).

The decoder 120 may receive a codeword from the encoder 110. The decoder 120 generates the syndrome s using the received codeword and the parity check matrix constructed by the encoder 110. The decoder 120 may generate a correction circuit that corrects at least some of error bits included in the codeword on the basis of the generated syndrome. The error bits may include bit flips.

The codeword generated by the encoder 110 may be referred to as a first codeword v, and the codeword received by the decoder 120 may be referred to as a second codeword v'.

When an error occurs in the second codeword v received by the decoder 120, an n-bit value of the second codeword v' that may be different from that of the codeword v may be stored in the memory device 20. The value of the second codeword v' may be decoded by the syndrome s in the decoder 120. The syndrome s may be a vector. The syndrome vector s may be calculated by multiplying the second codeword v' by the transpose of the parity check matrix H. That is, it can be expressed as $s = v'^* H^T$.

When the second codeword v' does not contain an error, v'=v, and thus the syndrome s may be 0.

When a 1-bit error is included in the i-th bit of the second codeword v', it may be expressed as $v' = v + e_i$ where $e_i$ is a vector in which only the i-th bit is 1 and the other bits are 0. Here, the result of the syndrome s may be the same as the transpose value of $h_i$, which is the i-th column of the parity check matrix H.

$$s = v'^* H^T = (v + e_i)^* H^T = e_i^* H^T = h_i^T$$

When s=0, the decoder 120 outputs the second codeword v' as a result value since it is considered that there is no error in the second codeword v'.

When $s = h_i^T$, the decoder 120 considers that the second codeword v' has a single error at the i-th bit position, and outputs a third codeword v'' bit-flipped at the i-th bit position of the second codeword v' as a result value. That is, the decoder 120 generates the third codeword v'' by correcting a value corresponding to the i-th bit position of the second codeword v' to 1 when the value is 0, and correcting the value corresponding to the i-th bit position to 0 when the value is 1.

The decoder 120 declares an 'uncorrectable error' when s≠0 and $s \neq h_i^T$ for all i.

As described above, errors that may be generated while storing data in the memory device 20 such as a DRAM cell and reading data from the memory device 20 through the system 1 and the method for providing an error correction code according to an embodiment can be minimized. Conventionally, when a single error correction (SEC) method is used, a large number of 3-bit aliasings (aliasing triples) have occurred in the process of detecting and correcting data errors due to the nature of codewords using a binary function. Therefore, according to an embodiment, as the encoder 110 receives a message word and constructs a parity check matrix according to the length of the received message word and the decoder 120 constructs a correction circuit based on a syndrome generated using the codeword and the parity check matrix generated by the encoder, a minimum number of aliasings may occur, so that reliability of the error correction code ECC provided by the error correction code providing system 1 can be improved.

According to the present invention, reliability of a device can be improved by reducing or minimizing occurrence of aliasing in providing an error correction code through a processor that applies a single error correction code generating minimal aliasing while reducing the number of operations since aliasing of overwhelmingly high probability occurs in a randomly selected code as the number of check bits increases in applying the SEC to a Dynamic Random Access Memory (DRAM) device.

The effects of the present invention are not limited to those mentioned above, and other unmentioned effects will be clearly understood by those skilled in the art from the following description.

What is claimed is:

1. A system for providing a minimal aliasing error correction code (ECC), the system comprising:
   a memory device including a plurality of memory cells; and
   a processor configured to receive a message word having a length of k, generating a codeword having a parity check matrix H and to store the codeword in the memory device, and to perform error correction code decoding according to a syndrome generated using the codeword read from the memory device and the parity check matrix H, and to output a decoded data;
   an encoder to receive a message word having a length of k, and to generate a codeword having an r*n parity check matrix H including an r*k data submatrix M containing k data bits and an r*r check submatrix C containing r check bits, wherein the r*n parity check matrix H includes all nonzero 4-bit columns, and the r*r check submatrix C is an identity matrix and includes invertible nonzero column vectors; and
   a decoder, implementing the minimal aliasing error correction code (ECC), configured to include a correction circuit which is configured to receive the codeword and to correct at least some of error bits included in the codeword according to the syndrome generated using the codeword and the r*n parity check matrix H, wherein
   r, k, and n are natural numbers greater than or equal to 1, n=k+r, and k=$2^{r-1}$.

2. The system according to claim 1, wherein the memory device includes a DRAM cell.

3. The system according to claim 1, wherein the minimal aliasing error correction code (ECC) includes single error correction (SEC), and all column vectors in the r*n parity check matrix H have nonzero binary values different from each other.

4. The system according to claim 1, wherein the encoder configured to specify a nonzero binary row vector v having a size of r, to classify a column vector having a result value of 0 obtained by multiplying the row vector v, among nonzero binary column vectors having a size of r, as a first column vector, and a column vector having a result value of nonzero as a second column vector, to construct the data submatrix M to include one of the first column vectors and k−1 of the second column vectors, and to construct the check submatrix C to include r−1 of the first column vectors and one of the second column vectors.

5. A method of providing a minimal aliasing error correction code (ECC), the method comprising:
   receiving a message word having a length of k, by a processor;
   encoding by generating a codeword having an r*n parity check matrix H including an r*k data submatrix M containing k data bits and an r*r check submatrix C containing r check bits, by the processor, the encoding further receiving a message word having a length of k, and generating a codeword having an r*n parity check matrix H including an r*k data submatrix M containing k data bits and an r*r check submatrix C containing r check bits, wherein the r*n parity check matrix H includes all nonzero 4-bit columns, and the r*r check submatrix C is an identity matrix and includes invertible nonzero column vectors; and
   decoding by implementing the minimal aliasing error correction code (ECC), including a correction circuit that receives the codeword and correcting at least some of error bits included in the codeword according to a syndrome generated using the codeword and the r*n parity check matrix H, by the processor, wherein
   r, k, and n are natural numbers, n=k+r, and r satisfies k=$2^{r-1}$.

6. The method according to claim 5, wherein the minimal aliasing error correction code (ECC) includes single error correction (SEC), and all column vectors in the r*n parity check matrix H have nonzero binary values different from each other.

7. The method according to claim 5, wherein the encoding step includes:
   specifying a nonzero binary row vector v having a size of r, by the processor;
   classifying a column vector having a result value of 0 obtained by multiplying the row vector v, among nonzero binary column vectors having a size of r, as a first column vector, and a column vector having a result value of nonzero as a second column vector, by the processor;
   constructing the data submatrix M to include one of the first column vectors and k−1 of the second column vectors, by the processor; and
   constructing the check submatrix C to include r−1 of the first column vectors and one of the second column vectors, by the processor.

8. The method according to claim 5, wherein the decoding step includes outputting the received codeword as a result value in response to detection of the received codeword does not contain an error, according to the syndrome.

9. The method according to claim 5, wherein the decoding step includes outputting a codeword in which a 1-bit error is corrected as a result value when the received codeword contains the 1-bit error, according to the syndrome.

* * * * *